(12) United States Patent
Knipper et al.

(10) Patent No.: US 11,562,967 B2
(45) Date of Patent: Jan. 24, 2023

(54) METHOD FOR FABRICATING A SEMICONDUCTOR PACKAGE, SEMICONDUCTOR PACKAGE AND EMBEDDED PCB MODULE

(71) Applicant: Infineon Technologies AG, Neubiberg (DE)

(72) Inventors: Richard Knipper, Regensburg (DE); Frank Daeche, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/208,363

(22) Filed: Mar. 22, 2021

(65) Prior Publication Data
US 2021/0313273 A1    Oct. 7, 2021

(30) Foreign Application Priority Data
Apr. 6, 2020 (DE) .......................... 102020109557.0

(51) Int. Cl.
*H01L 23/538* (2006.01)
*H01L 21/32* (2006.01)
(Continued)

(52) U.S. Cl.
CPC .......... *H01L 23/5389* (2013.01); *H01L 21/32* (2013.01); *H01L 21/32051* (2013.01);
(Continued)

(58) Field of Classification Search
CPC ................. H01L 23/5389; H01L 21/32; H01L 21/32051; H01L 21/561; H01L 21/568;
(Continued)

(56) References Cited

U.S. PATENT DOCUMENTS 7,626,124 B2 * 12/2009 Okamoto ................. H05K 3/24
174/260
7,838,978 B2 * 11/2010 Mahler ............... H01L 21/6835
257/E23.169
(Continued)

FOREIGN PATENT DOCUMENTS

| DE | 102006037532 A1 | 2/2008 |
| DE | 102007041926 A1 | 3/2009 |
| DE | 102014117127 A1 | 5/2015 |

*Primary Examiner* — Vu A Vu
(74) *Attorney, Agent, or Firm* — Murphy, Bilak & Homiller, PLLC

(57) ABSTRACT

A method for fabricating a semiconductor package includes: providing a semiconductor wafer having opposing first and second sides, the semiconductor wafer being arranged on a first carrier such that the second side of the wafer faces the carrier; masking sawing lines on the first side of the semiconductor wafer with a mask; depositing a first metal layer on the masked first side of the semiconductor wafer by cold spraying or by high velocity oxygen fuel spraying or by cold plasma assisted deposition, such that the first metal layer does not cover the sawing lines, the deposited first metal layer having a thickness of 50 μm or more; singulating the semiconductor wafer into a plurality of semiconductor dies by sawing the semiconductor wafer along the sawing lines; and encapsulating the plurality of semiconductor dies with an encapsulant such that the first metal layer is exposed on a first side of the encapsulant.

20 Claims, 6 Drawing Sheets

(51) Int. Cl.
    *H01L 21/3205* (2006.01)
    *H01L 21/56* (2006.01)
    *H01L 21/683* (2006.01)
    *H01L 21/78* (2006.01)
    *H01L 23/544* (2006.01)

(52) U.S. Cl.
    CPC .......... *H01L 21/561* (2013.01); *H01L 21/568* (2013.01); *H01L 21/6835* (2013.01); *H01L 21/78* (2013.01); *H01L 23/5383* (2013.01); *H01L 23/5386* (2013.01); *H01L 23/544* (2013.01); *H01L 2221/68327* (2013.01); *H01L 2221/68354* (2013.01); *H01L 2221/68368* (2013.01); *H01L 2223/5446* (2013.01)

(58) Field of Classification Search
    CPC ................. H01L 21/6835; H01L 21/78; H01L 23/5383; H01L 23/5386; H01L 23/544; H01L 2221/68327; H01L 2221/68354; H01L 2221/68368; H01L 2223/5446; H01L 23/3114; H01L 24/03; H01L 21/4814; H01L 21/56; H01L 21/784; H01L 23/3157; H01L 23/482; H05K 1/185; H05K 1/18
    USPC ........................................................ 257/668
    See application file for complete search history.

(56) References Cited

U.S. PATENT DOCUMENTS

| | | | |
|---|---|---|---|
| 9,040,346 B2 * | 5/2015 | Nikitin | H01L 24/82 438/678 |
| 10,157,765 B2 * | 12/2018 | Stranzl | H01L 21/78 |
| 2010/0019381 A1 | 1/2010 | Haeberlen et al. | |

* cited by examiner

METHOD FOR FABRICATING A SEMICONDUCTOR PACKAGE, SEMICONDUCTOR PACKAGE AND EMBEDDED PCB MODULE

TECHNICAL FIELD

This disclosure relates in general to a method for fabricating a semiconductor package, to a semiconductor package and to an embedded PCB module.

BACKGROUND

Semiconductor packages, in particular power semiconductor packages, may comprise one or more metal layers arranged on the front and/or backside of a semiconductor die. These metal layers may have a comparatively high thickness in order to improve electrical conductivity and/or heat dissipation capabilities of the semiconductor package. However, providing these thick metal layers may increase the overall costs and/or fabrication time of semiconductor packages. Furthermore, semiconductor wafer warpage, planarity requirements, machining tolerances, slowness of soldering processes etc. may be problematic. Improved methods for fabricating a semiconductor package, improved semiconductor packages and improved embedded PCB modules can help with solving these and other problems.

The problem on which the invention is based is solved by the features of the independent claims. Further advantageous examples are described in the dependent claims.

SUMMARY

Various aspects pertain to a method for fabricating a semiconductor package, the method comprising: providing a semiconductor wafer comprising a first side and an opposing second side, the semiconductor wafer being arranged on a first carrier such that the second side of the semiconductor wafer faces the carrier, masking sawing lines on the first side of the semiconductor wafer with a mask, depositing a first metal layer on the masked first side of the semiconductor wafer by cold spraying or by high velocity oxygen fuel spraying or by cold plasma assisted deposition, such that the first metal layer does not cover the sawing lines, the deposited first metal layer having a thickness of 50 μm or more, singulating the semiconductor wafer into a plurality of semiconductor dies by sawing the semiconductor wafer along the sawing lines, and encapsulating the plurality of semiconductor dies with an encapsulant such that the first metal layer is exposed on a first side of the encapsulant.

Various aspects pertain to a semiconductor package, comprising: a semiconductor die comprising a first side and an opposing second side, a seed layer deposited on the first side of the semiconductor die, a first metal layer deposited on the seed layer, and an encapsulant encapsulating the semiconductor die, wherein the first metal layer is exposed on a first side of the encapsulant, wherein the first metal layer has a different crystal structure than the seed layer, and wherein the first metal layer has a thickness of at least 50 μm, measured perpendicular to the first side of the semiconductor die.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Identical reference numerals designate corresponding similar parts.

DETAILED DESCRIPTION

To the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The examples of a semiconductor package described below may use various types of semiconductor dies or circuits incorporated in the semiconductor dies, among them AC/DC or DC/DC converter circuits, power MOS transistors, power Schottky diodes, JFETs (Junction Gate Field Effect Transistors), power bipolar transistors, logic integrated circuits, analogue integrated circuits, power integrated circuits, chips with integrated passives, etc.

The semiconductor dies can be manufactured from specific semiconductor material, for example Si, SiC, SiGe, GaAs, GaN, or from any other semiconductor material, and, furthermore, may contain one or more of inorganic and organic materials that are not semiconductors, such as for example insulators, plastics or metals.

The semiconductor packages described below may include one or more semiconductor dies. By way of example, one or more semiconductor power dies may be included. Further, one or more logic integrated circuits may be included in the semiconductor packages. The logic integrated circuits may be configured to control the integrated circuits of other semiconductor dies, for example the integrated circuits of power semiconductor dies. The logic integrated circuits may be implemented in logic dies.

Figure 1:
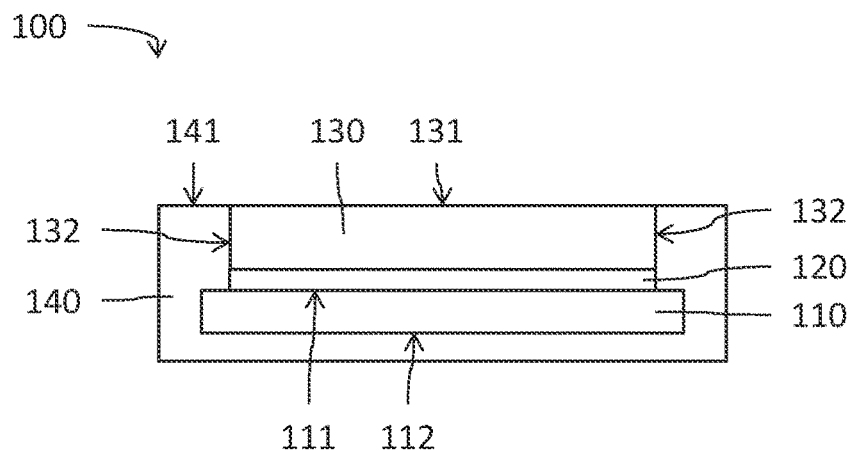
FIG. 1 shows a sectional view of a semiconductor package comprising a comparatively thick metal layer on a first side of a semiconductor die.

FIG. 1 shows a sectional view of a semiconductor package 100 comprising a semiconductor die 110, a seed layer 120, a first metal layer 130 and an encapsulant 140.

The semiconductor die 110 comprises a first side 111 and an opposing second side 112. The seed layer 120 is deposited on the first side 111 of the semiconductor die 110. The first metal layer 130 is deposited on the seed layer 120. The encapsulant 140 encapsulates the semiconductor die 110 such that the first metal layer 130 is exposed on a first side 141 of the encapsulant 140.

The first metal layer 130 differs from the seed layer 120 at least in so far as having a different crystal structure than the seed layer 120.

The semiconductor die 110 may e.g. be a power semiconductor die configured to operate with a high voltage and/or a high electrical current. The semiconductor die 110 may e.g. comprise a first load electrode (e.g. a source electrode or a drain electrode or an emitter electrode or a collector electrode) on its first side 111 and a second load electrode on its second side 112. The semiconductor die 110 may further comprise a control electrode (e.g. a gate electrode) on its first side 111 or on its second side 112.

The semiconductor die 110 may have any suitable dimensions, e.g. a length and a width (measured in the plane of the first side 111) in the range of 2 mm to 2 cm, for example about 5 mm. The semiconductor die 110 may e.g. have a thickness (measured perpendicular to the first side 111) in the range of 50 µm to 800 µm.

The seed layer 120 may be arranged on an electrode of the semiconductor die, e.g. on a load electrode or on a control electrode. The seed layer 120 and the first metal layer 130 may be configured as electrical contacts for the respective electrode of the semiconductor die 110.

According to an example, the seed layer 120 may comprise or consist of Al, Cu or Fe or any other suitable metal or metal alloy. The seed layer 120 may comprise a single layer or a layer stack of different metal layers. The seed layer 120 may be configured to act as an anchor for the deposition of the first metal layer 130. The seed layer 120 may have a thickness in the micrometer range, for example in the range of 1 µm to 20 µm, in particular about 10 µm.

The seed layer 120 may be deposited on the semiconductor die 110 for example by electroplating, by vapor deposition, by sputtering or by any other suitable technique. According to an example, the seed layer 120 is arranged directly on the semiconductor die 110. According to another example, one or more further metal layers may be arranged between the semiconductor die 110 and the seed layer. For example, a diffusion barrier layer may be arranged between the seed layer 120 and the semiconductor die 110. The one or more further metal layers may e.g. comprise or consist of Ti, W or TiW. The one or more further metal layers may e.g. have a thickness in the nanometer range, for example in the range of 50 nm to 500 nm.

The seed layer 120 may cover the first side 111 of the semiconductor die 110 completely. However, it is also possible that only part of the first side 111 is covered by the seed layer 120, as e.g. shown in FIG. 1. The seed layer 120 may be an unstructured (homogeneous) layer or it may be a structured layer (the seed layer 120 may e.g. be structured by etching or laser ablation). For example, the seed layer 120 may be structured such that it does not cover a rim of the semiconductor die 110 or such that a first part of the seed layer 120 covers a load electrode and a second part of the seed layer 120, spaced apart from the first part, covers a control electrode.

According to an example, the first metal layer 130 comprises or consists of Cu, Fe, Al or any other suitable metal or metal alloy. The first metal layer 130 may completely cover the seed layer 120. The first metal layer 130 may be arranged directly on the seed layer 120, that is, no further layer may be arranged between the seed layer 120 and the first metal layer 130.

The first metal layer 130 may be deposited on the seed layer for example by using a technique that comprises cold spraying or high velocity oxygen fuel spraying or cold plasma assisted deposition. These deposition techniques may comprise accelerating solid (powder) particles of the material which forms the first metal layer 130 towards the seed layer 120. The accelerated particles may hit the seed layer 120, thereby undergoing plastic deformation and adhering to the seed layer 120. The first metal layer 130 may therefore have a granular microstructure. Furthermore, the particles may coalesce with each other forming a much more stable body than would be achievable with e.g. a sintering process. If a sintering process was used instead, the particles of the metal layer might be more loosely connected to each other which might result in a greater brittleness of the metal layer and might require additional processing to achieve sufficient stability, increasing fabrication time and fabrication costs.

The particle impacts may deform the surface of the seed layer 120. For example, prior to depositing the first metal layer 130 the seed layer 120 may have an essentially flat surface. The impacting particles however may create a surface with a roughness of e.g. several micrometers. Since the particles forming the first metal layer 130 may not necessarily be accelerated onto the seed layer 120 in a homogeneous spatial distribution, the seed layer 120 may be affected to a different degree (i.e. to a different depth) across its surface.

In the semiconductor package 100 the first metal layer 130 has a thickness of at least 50 µm, measured perpendicular to the first side 111 of the semiconductor die 110. The first metal layer 130 may have any suitable thickness, e.g. a thickness of about 50 µm or more, about 100 µm or more, about 200 µm or more, about 500 µm or more or about 1 mm or more.

Deposition methods like cold spraying, high velocity oxygen fuel spraying or cold plasma assisted deposition may allow for the fabrication of much thicker layers at reasonable process times and process costs than e.g. electroplating or sputtering. At least for this reason it may be beneficial to fabricate the comparatively thick first metal layer 130 using such a deposition technique. Furthermore, fabricating the first metal layer 130 using such deposition techniques may also provide certain benefits compared to e.g. fabricating the first metal layer 130 by placing a metal sheet onto the semiconductor die 110. For example, using metal sheets may lead to issues with machining tolerances, planarity and wafer bow.

The encapsulant 140 may e.g. be a molded body and it may comprise a polymer material. The encapsulant 140 may be configured to protect the semiconductor die from environmental impacts. The encapsulant 140 may comprise a recess, wherein the seed layer 120 and the first metal layer 130 are arranged within the recess. The first metal layer 130 may comprise an outer surface 131 that is exposed at the first side 141 of the encapsulant 140. According to an example, the outer surface 131 and the first side 141 may essentially be coplanar. According to another example, the outer surface 131 protrudes from the first side 141. The first metal layer 130 may further comprise lateral sides 132 which may be covered by the encapsulant 140.

According to an example, the encapsulant 140 at least partially covers the first side 111 of the semiconductor die 110 (i.e. those parts that are not covered by the seed layer 120 and first metal layer 130). According to an example, the encapsulant 140 partially or completely covers the second side 112 of the semiconductor die 110. According to an example, the encapsulant 140 completely or partially covers lateral sides of the semiconductor die 110 connecting the first and second sides 111, 112.

The semiconductor package 100 may have dimensions that are only slightly bigger than the dimensions of the semiconductor die 110 itself. For example, the semiconductor package may have a length and width in the range of 2 mm to 2 cm, for example about 5 mm and a thickness in the range of 100 µm to 1 mm.

Figure 2:
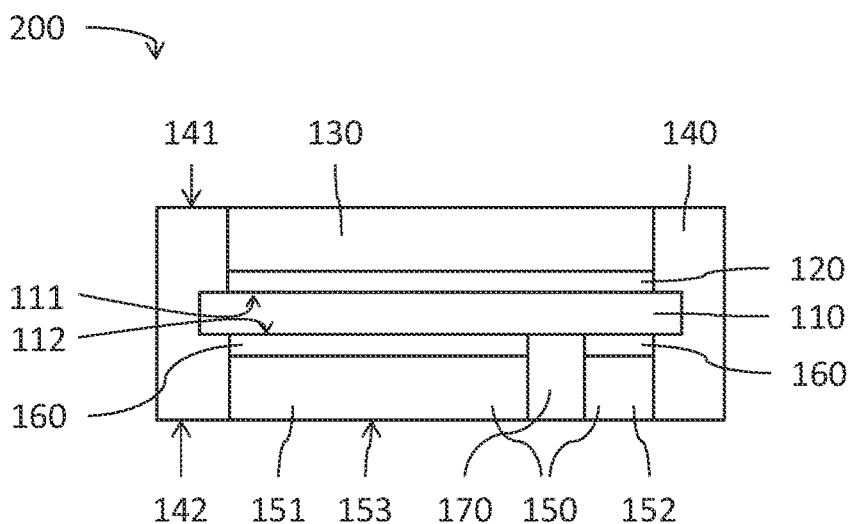
FIG. 2 shows a sectional view of a semiconductor package comprising comparatively thick metal layers on two opposing sides of a semiconductor die.

FIG. 2 shows a sectional view of a further semiconductor package 200 which may be similar or identical to the semiconductor package 100, except for the differences described in the following.

The semiconductor package 200 may comprise all parts described with respect to the semiconductor package 100 and it further comprises a second metal layer 150. The second metal layer 150 may be similar or identical to the first metal layer 130. The second metal layer 150 may be arranged at the second side 112 of the semiconductor die, opposite the first metal layer 130.

The semiconductor package 200 may further comprise a second seed layer 160 arranged on the second side 112 of the semiconductor die 110 between the semiconductor die 110 and the second metal layer 150. The second seed layer 160 may be similar or identical to the seed layer 120.

According to an example, the second metal layer 150 comprises the same material or material composition as the first metal layer 130. According to another example, the first and second metal layers 130, 150 comprise different materials or material compositions. The second metal layer 150 may be fabricated using the same deposition technique as the first metal layer 130. The first and second metal layers 130, 150 may essentially have the same thickness or they may have different thicknesses.

According to an example, the second metal layer 150 may be structured. In the example shown in FIG. 2 the second metal layer 150 is structured such that a first part 151 is e.g. arranged over a load or power electrode of the semiconductor die 110 and a second part 152 is e.g. arranged over a control electrode of the semiconductor die 110. The first and second parts 151, 152 may be separated from one another by a gap 170. The gap 170 may be filled by the encapsulant 140.

The second metal layer 150 may comprise an outer surface 153 which may be exposed at a second side 142 of the encapsulant, opposite the first side 141. According to an example, the outer surface 153 and the second side 142 may be essentially coplanar. According to another example, the outer surface 153 protrudes from the second side 142.

The second seed layer 160 and the second metal layer 150 may be fabricated using the same techniques as the seed layer 120 and the first metal layer 130, respectively. According to an example, arranging the first and second metal layers 130, 150 on the opposing first and second sides 111, 112 of the semiconductor die 110 may help with preventing wafer warpage. According to an example, the first and second metal layers 130, 150 and the seed layer 120 and second seed layer 160 may be configured to provide electrical connections to the semiconductor die 110 which have small electrical and thermal resistances.

According to an example, the semiconductor packages 100 and 200 may be embedded in a printed circuit board (PCB) module. Such an embedded module may advantageously have a smaller form factor other types of modules.

Figure 3:
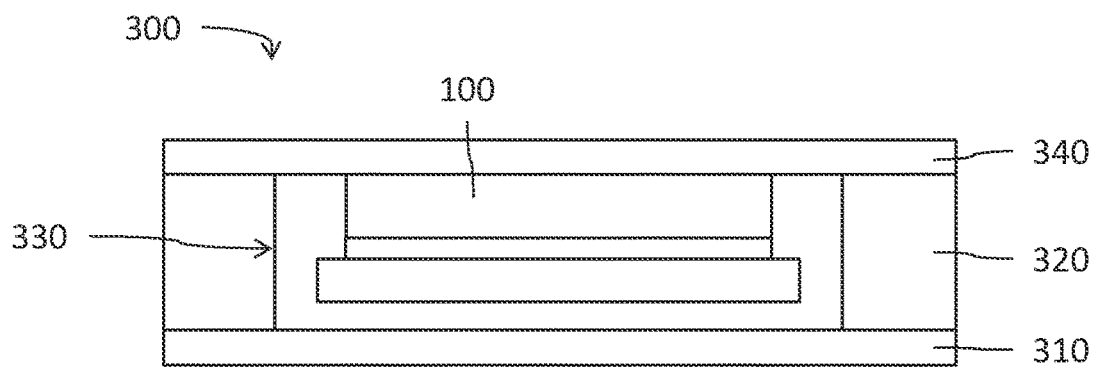
FIG. 3 shows a sectional view of an embedded PCB module.

FIG. 3 shows a sectional view of an embedded PCB module 300 comprising a base plate 310, a further layer 320 and the semiconductor package 100. According to another example, the embedded PCB module 300 comprises the semiconductor package 200 instead of the semiconductor package 100.

According to an example, the base plate 310 is electrically insulating, e.g. due to an electrically insulating surface treatment. According to another example, the base plate 310 is electrically conductive. The base plate 310 may e.g. comprise or consist of Al, Cu or Fe. A coupling layer, e.g. a glue, may be arranged between the base plate and the semiconductor package 100. According to an example, the base plate 310 may be configured to be arranged on a heat sink configured to dissipate heat away from the semiconductor package 100. A thermal interface material (TIM) may be arranged between the base plate 310 and the heat sink.

The further layer 320 is arranged on the base plate 310. The further layer 320 may be electrically insulating and may e.g. comprise or consist of a polymer or an epoxy. According to an example, the further layer 320 is a prepreg layer. According to another example, the further layer 320 comprises or consists of an electrically conductive material, e.g. Cu. The semiconductor die 110 may be insulated from the further layer 320 by the encapsulant 140. The further layer 320 comprises a cavity 330, wherein the semiconductor package 100 is arranged within the cavity 330. The further layer 320 may e.g. have essentially the same thickness as the semiconductor package 100.

According to an example, the embedded PCB module 300 comprises a plurality of semiconductor packages, which may be identical semiconductor packages or different types of semiconductor packages. The further layer 320 may comprise a plurality of cavities 330, e.g. such that each semiconductor package is arranged within a different cavity 330.

The embedded PCB module 300 further comprises an upper plate 340 arranged over the further layer 320 and the semiconductor package 100. The upper plate may comprise an electrically insulating material, e.g. an epoxy or a polymer. The upper plate 340 may comprise one or more vias electrically coupled to the semiconductor package 100 (i.e. coupled to the first metal layer 130 and/or to the second metal layer 150). The upper plate 340 may further comprise conductive traces coupled to the vias. The upper plate 340 may be configured to have one or more semiconductor devices, e.g. logic chips for controlling the semiconductor package 100, arranged on its surface.

The embedded PCB module 300 may for example be a power electronics module comprising a three phase driver circuitry. The embedded PCB module 300 may provide improved electrical and thermal performances, less thermal resistance and a reduced form factor compared to other modules, wherein a semiconductor package is not embedded in the way described above.

With respect to FIGS. 4A to 4G the semiconductor package 200 is shown in different stages of fabrication according to an example of a method for fabricating a semiconductor package. The semiconductor package 100 may be fabricated in an essentially identical manner. However, the acts described with reference to FIG. 4D need not be performed in this case.

Figure 4A:
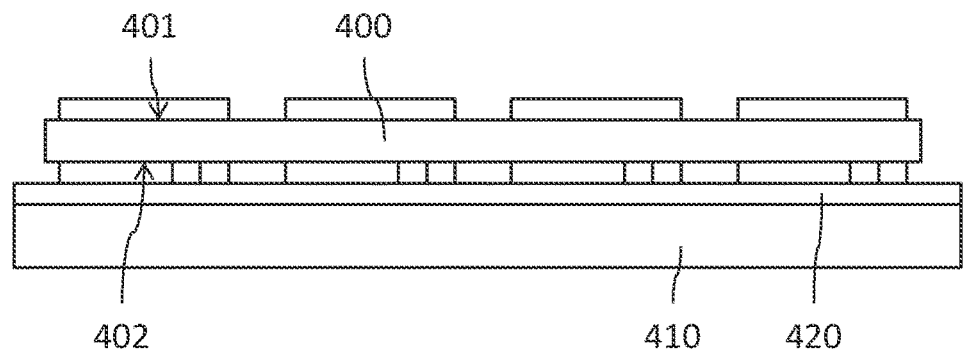
FIGS. 4A to 4G show sectional views of a semiconductor package in various stages of fabrication according to a method for fabricating a semiconductor package.

FIG. 4A shows a semiconductor wafer 400 comprising a first side 401 and an opposing second side 402. The semiconductor wafer 400 is arranged on a first carrier 410 such that the second side 402 of the semiconductor wafer 400 faces the first carrier 410. The semiconductor wafer 400 may be a thinned wafer, e.g. obtained by grinding a thick wafer.

According to an example, the semiconductor wafer 400 is attached to the first carrier 410 by an adhesive foil 420. According to another example, no adhesive foil 420 is used.

According to an example, the seed layer 120 and/or the second seed layer 160 are deposited over the first side 401 and second side 402 of the semiconductor wafer 400. The seed layer 120 and/or the second seed layer 160 may e.g. be deposited by electroplating or by sputtering. The seed layer 120 and/or the second seed layer 160 may be deposited in a process step prior to the state of fabrication shown in FIG. 4A.

Figure 4B:
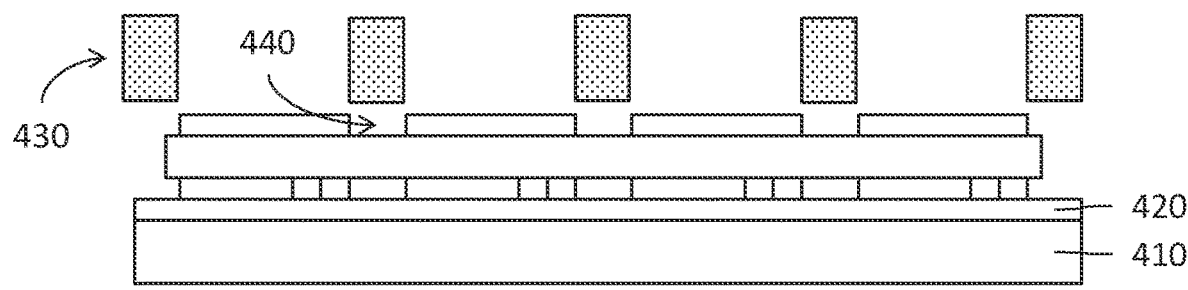

As shown in FIG. 4B, a mask or shadow mask 430 is arranged over the first side 401 of the semiconductor wafer 400. The shadow mask 430 is configured to mask sawing lines 440 on the first side 401 of the semiconductor wafer 400. The shadow mask 430 may furthermore be configured to mask the first side 401 such that the first metal layer 130 may only be deposited on the semiconductor wafer 400 over one or more electrodes.

Figure 4C:
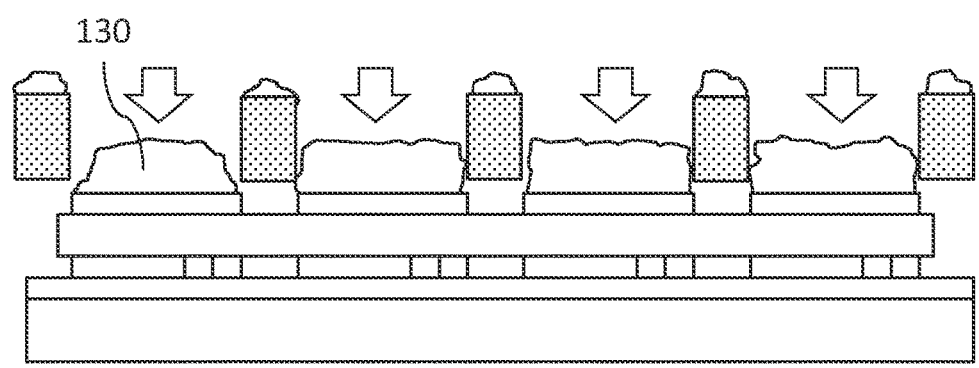

The shadow mask 430 may comprise or consist of any suitable material, e.g. a material which does not form welded joints with the material constituting the first metal layer 130. According to an example, the shadow mask 430 comprises or consists of stainless steel. However, it is also possible that the shadow mask 430 comprises or consists of a material which does form welded joints with the material constituting the first metal layer 130. In that case the shadow mask 430 may be a single-use item which is replaced after each use. The shadow mask 430 may be suspended above the first side 401 of the semiconductor wafer 400 without coming into contact with the first side 401 as shown in FIG. 4C. This may help with avoiding damage to the semiconductor wafer 400. However, it is also possible that the shadow mask 430 is arranged on the semiconductor wafer 400 such that it touches the first side 401.

According to an example, the shadow mask 430 is no solid body arranged over the semiconductor wafer 400 as shown in FIG. 4C, but instead a material layer that is deposited on the first side 401 of the semiconductor wafer 400 and then structured to cover the sawing lines 440 as described above. For example, the shadow mask 430 may be a photoresist mask which may be deposited and structured using any suitable technique known in the art. The shadow mask 430 may for example comprise or consist of a ceramic or an organic compound. The material constituting the first metal layer 130 may not readily adhere to these materials.

A deposited shadow mask 430 may be abrasively removed when depositing the first metal layer 130. It may therefore be desirable to adjust the thickness of the deposited shadow mask 430 accordingly, e.g. such that no or almost no shadow mask 430 remains after the first metal layer 130 has been deposited. For example, the thickness of the deposited shadow mask 430 should be about two times, about 2.5 times or about three times the thickness of the first metal layer 130. The shadow mask 430 or the remainders of the shadow mask 430 may be removed from the first side 401 after the first metal layer 130 has been deposited.

As shown in FIG. 4C, the first metal layer 130 is deposited on the masked first side 401 of the semiconductor wafer 400. Due to the presence of the shadow mask 430, no material is deposited over the sawing lines 440. The first metal layer 130 may e.g. be deposited over the first side 401 by cold spraying or by high velocity oxygen fuel spraying or by cold plasma assisted deposition.

If a semiconductor package is fabricated that comprises a deposited metal layer on only the first side 401, e.g. the semiconductor package 100, then a singulation process may follow the act of depositing the first metal layer 130 described with reference to FIG. 4C. If however a semiconductor package is fabricated that comprises a deposited metal layer on both sides 401, 402, then it may be necessary to flip over the semiconductor wafer 400 as described below.

Figure 4D:
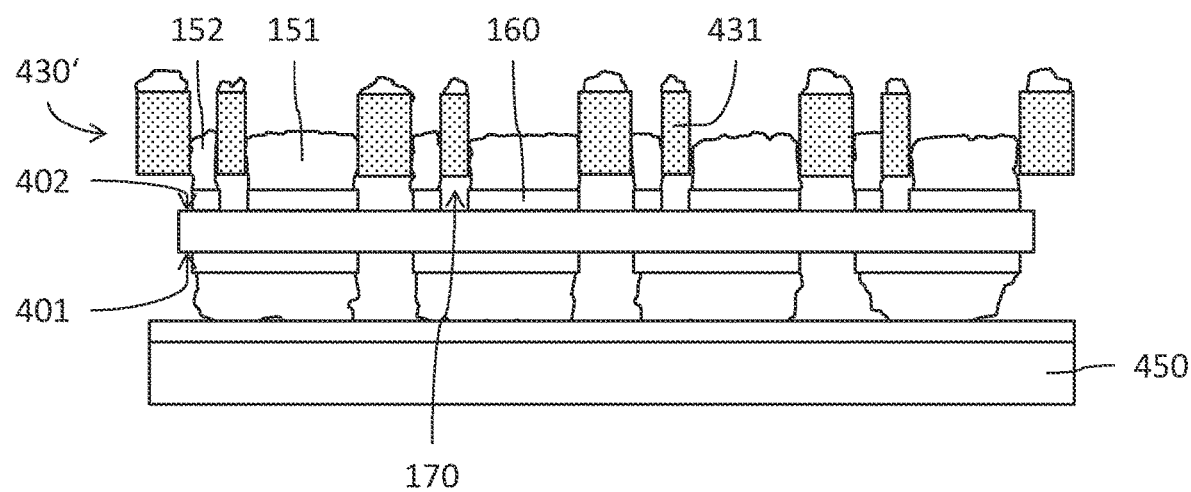

FIG. 4D shows the semiconductor wafer 400 flipped over and arranged on a second carrier 450 such that the first side 401 faces the second carrier 450. The second carrier 450 may be similar or identical to the first carrier 410. Afterwards, the sawing lines 440 are masked over the second side 402 by a shadow mask 430' as described with reference to FIG. 4B.

According to an example, the shadow masks 430 and 430' are the same shadow mask. According to another example, the shadow mask 430' is different from the shadow mask 430. For example, the shadow mask 430' may comprise additional segments 431 configured to allow depositing the second metal layer 150 in the form of the distinct parts 151, 152, separated by the gap 170. The second metal layer 150 may be deposited in the same manner as the first metal layer 130.

According to an example, some material of the second metal layer 150 and/or the second seed layer 160 may be deposited in the gap 170. This excess material may be removed by a dedicated removal process, e.g. by etching or laser ablation or any other suitable technique.

Figure 4E:
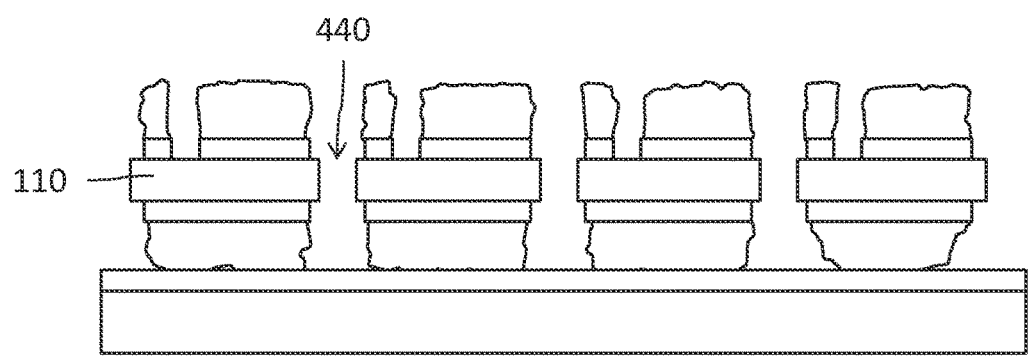

As shown in FIG. 4E, the semiconductor wafer 400 is singulated into a plurality of semiconductor dies 110 by sawing the semiconductor wafer 400 along the sawing lines 440. Since no material of the comparatively thick first metal layer 130 and/or second metal layer 150 is arranged over the sawing lines 440, it may not be necessary to clear the sawing lines 440 of obstructing material prior to singulation with a dedicated removal process.

Figure 4F:
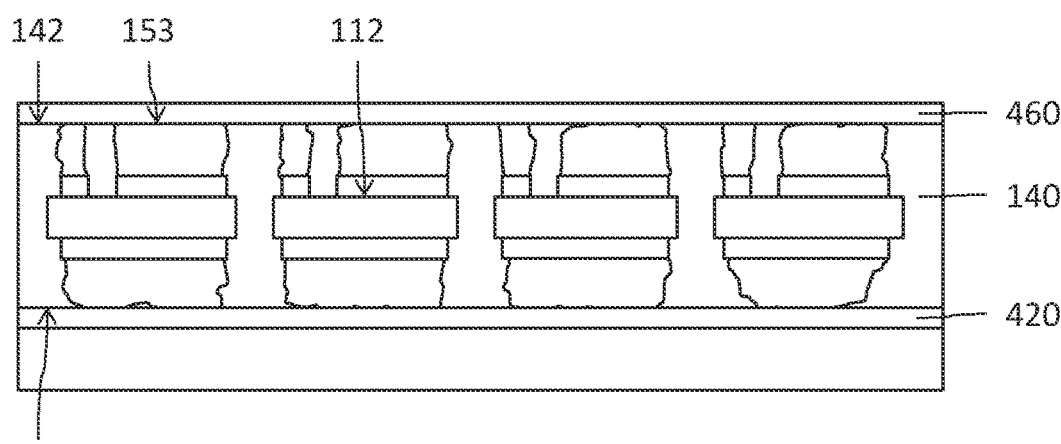

As shown in FIG. 4F, a film 460 may be arranged over the second metal layer 150 such that it covers the outer surface 153. In the case of fabricating the semiconductor package 100, which does not comprise the second metal layer 150 on the second side 112 of the semiconductor dies 110, the film 460 may instead cover the second side 112.

Subsequently, a molding process may be performed to encapsulate the plurality of semiconductor dies 110 with the encapsulant 140. The first metal layer 130 is exposed on the first side 141 of the encapsulant 140, e.g. because it is covered by adhesive foil 420. The second metal layer 150 may be exposed on the second side 142 of the encapsulant 140, e.g. because it is covered by the film 460.

According to an example, the molding process may be performed without covering the outer surface 153 of the second metal layer 150 (or the second side 112 of the semiconductor dies 110, respectively) with the film 460.

Figure 4G:
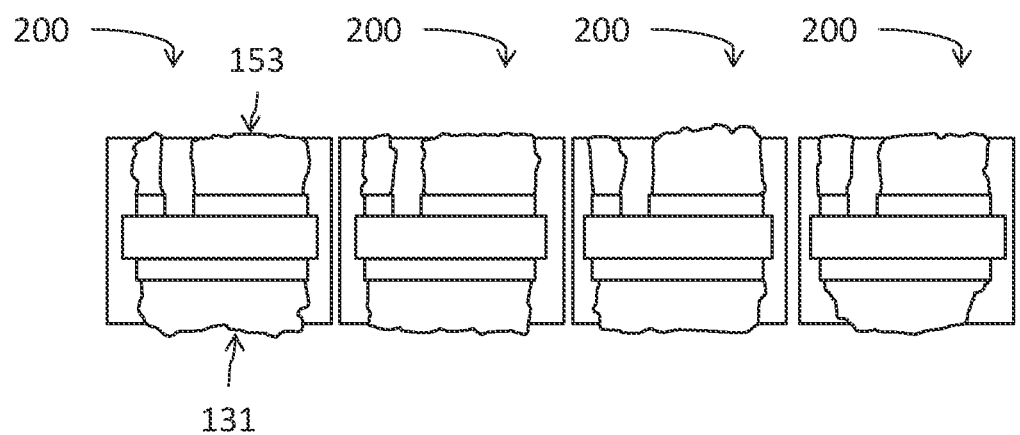

As shown in FIG. 4G, the semiconductor packages 200 (or the semiconductor packages 100) may be singulated from the semiconductor wafer 400 by cutting the encapsulant 140 along the sawing lines 440. FIG. 4G furthermore shows that the outer surfaces 131, 153 of the first and second metal layers 130, 150 may have an at least somewhat uneven or rough structure, e.g. because the outer surfaces 131, 153 were not planarized with a dedicated planarization process after deposition. The outer surfaces 131, 153 may nevertheless be sufficiently smooth to be used as electrical contacts of the semiconductor package 200.

According to another example, a planarization process, e.g. a grinding process, is used to smooth out the outer surfaces 131, 153 for use as electrical contacts.

Figure 5:
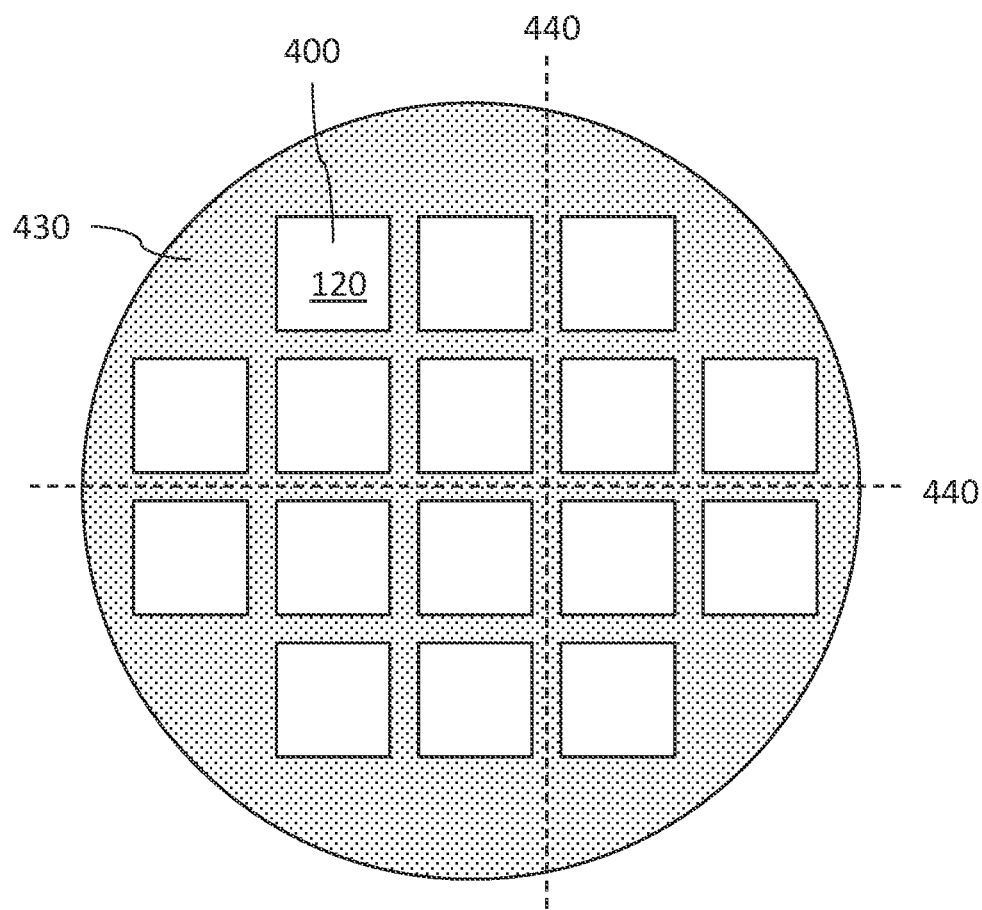
FIG. 5 shows a top down view of a semiconductor wafer and a shadow mask arranged over the semiconductor wafer.

FIG. 5 shows a top down view of the semiconductor wafer 400 and the shadow mask 430 as shown in FIG. 4B. Furthermore, the location of two exemplary perpendicular sawing lines 440 is indicated in FIG. 5 by dashed lines.

Figure 6:
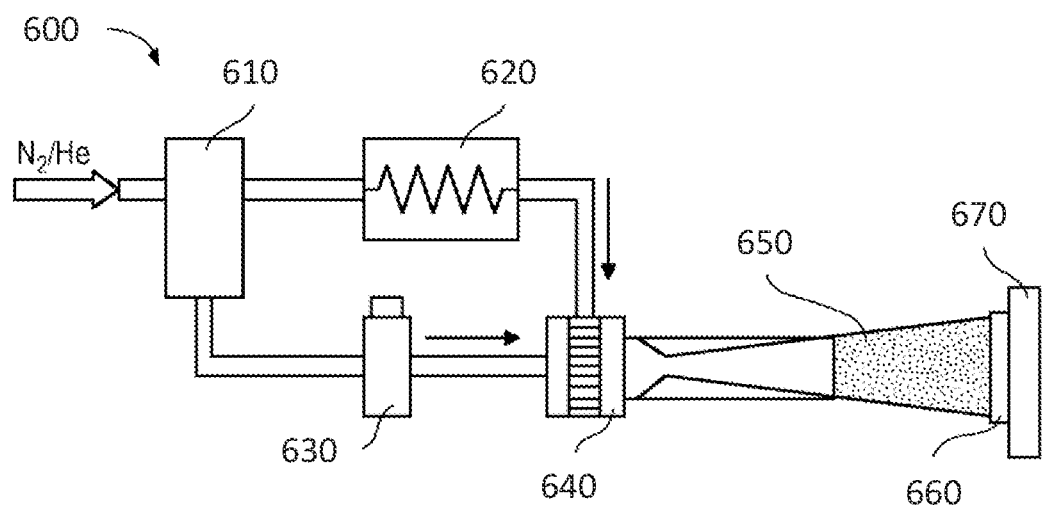
FIG. 6 schematically shows an arrangement for depositing a metal layer by applying a cold gas spraying technique.

FIG. 6 schematically illustrates an arrangement 600 for applying a cold gas spraying (also termed "cold spraying") technique. The arrangement 600 may e.g. be used for depositing the first metal layer 130 and/or the second metal layer 150.

The arrangement 600 may include a gas control module 610, an electric heater 620, a powder feeder 630, and a supersonic nozzle 640. A working gas, such as e.g. $N_2$ or He, may enter the arrangement 600 at an inlet. In an upper processing path, the gas control module 610 may forward controlled amounts of the working gas to the electric heater 620 where the gas may be heated. The heated working gas stream may then be forwarded to the supersonic nozzle 640. In a lower processing path, the powder feeder 630 may provide solid powder particles of a deposition material to the supersonic nozzle 640. For example, the powder particles may have a diameter from about 1 micrometer to about 50 micrometer. The powder particles may be inserted at high pressure at the nozzle entrance and may be accelerated in a supersonic gas jet to velocities up to from about 500 m/s to about 1000 m/s. A gas stream 650 including the powder particles exiting the supersonic nozzle 640 may have a temperature in a range from about 100° C. to about 500° C. The particle stream 650 may hit a target 660 which may be arranged on a substrate 670.

Cold plasma spraying (also termed "cold plasma assisted deposition") techniques may be similar to cold gas spraying techniques. In cold plasma spraying the material to be deposited may not be accelerated by means of a supersonic gas jet, but may instead receive the required kinetic energy for acceleration from a plasma. In a similar fashion, the accelerated deposition material may be provided by a "plasma nozzle".

Figure 7:
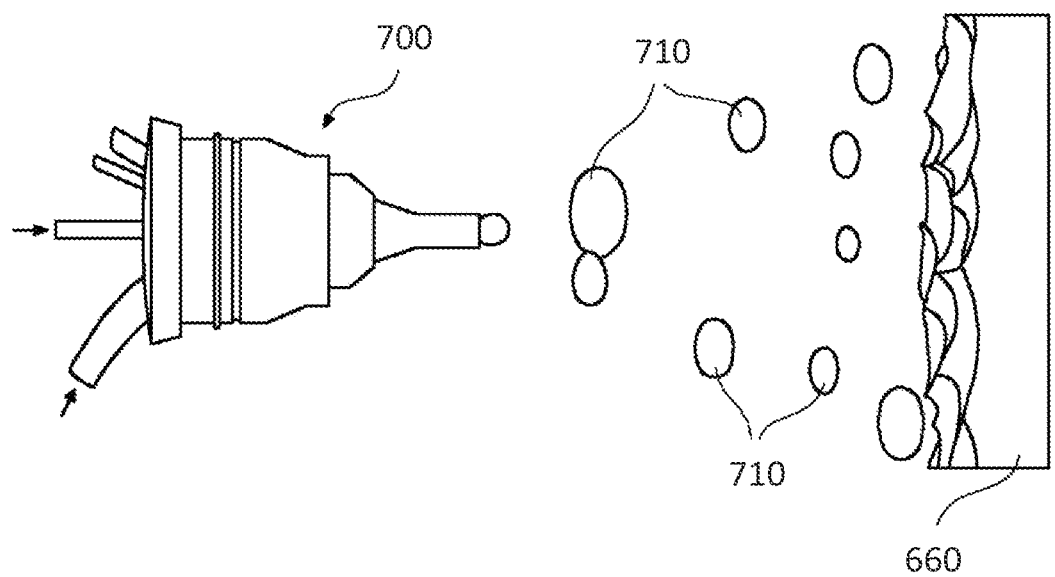
FIG. 7 schematically shows a supersonic nozzle providing a gas stream comprising particles to be deposited on a target.

FIG. 7 schematically illustrates a supersonic nozzle 700 providing a gas stream including particles 710 to be deposited on a target 660. During impact with the target 660, the particles 710 may undergo plastic deformation and may adhere to a surface of the target 660. In general, metals, polymers, ceramics, composite materials, and nanocrystalline powders may be deposited using cold gas spraying. The powders used in cold gas spraying may not necessarily be melted during the spraying process. In particular, the surface of a material deposited by a cold gas spraying technique may have a dented surface structure as exemplarily shown in the cross-sectional side view of FIG. 7.

Figure 8:
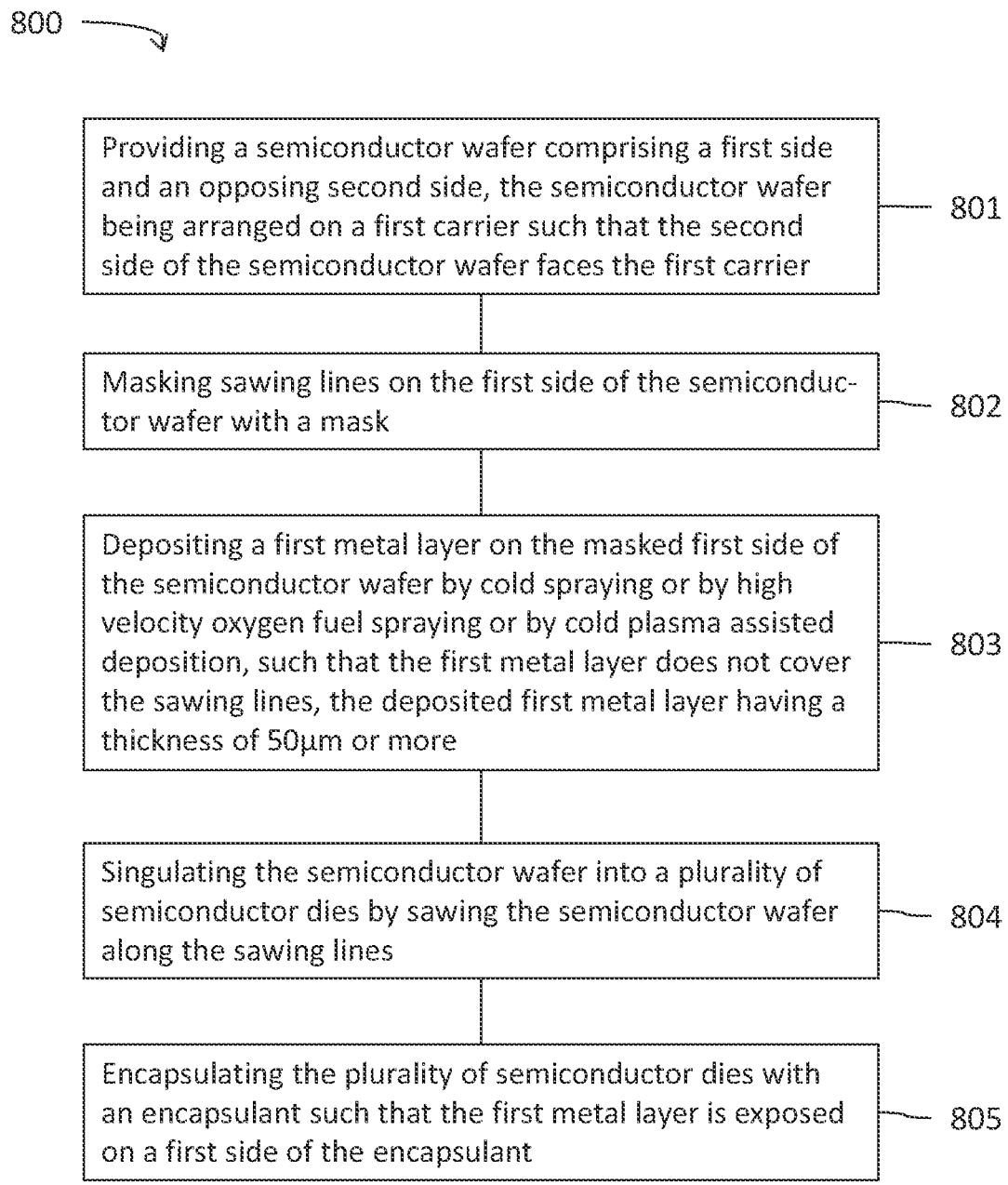
FIG. 8 is a flow chart of a method for fabricating a semiconductor package according to an example.

FIG. 8 is a flow chart of a method 800 for fabricating a semiconductor package. The method 800 may for example be used for fabricating the semiconductor packages 100 and 200.

The method 800 comprises at 801 an act of providing a semiconductor wafer comprising a first side and an opposing second side, the semiconductor wafer being arranged on a first carrier such that the second side of the semiconductor wafer faces the first carrier, at 802 an act of masking sawing lines on the first side of the semiconductor wafer with a mask, at 803 an act of depositing a first metal layer on the masked first side of the semiconductor wafer by cold spraying or by high velocity oxygen fuel spraying or by cold plasma assisted deposition, such that the first metal layer does not cover the sawing lines, the deposited first metal layer having a thickness of 50 µm or more, at 804 an act of singulating the semiconductor wafer into a plurality of semiconductor dies by sawing the semiconductor wafer along the sawing lines, and at 805 an act of encapsulating the plurality of semiconductor dies with an encapsulant such that the first metal layer is exposed on a first side of the encapsulant.

In the following the method for fabricating semiconductor packages and the semiconductor packages are further described using specific examples.

Example 1 is a method for fabricating a semiconductor package, the method comprising: providing a semiconductor wafer comprising a first side and an opposing second side, the semiconductor wafer being arranged on a first carrier such that the second side of the semiconductor wafer faces the carrier, masking sawing lines on the first side of the semiconductor wafer with a mask, depositing a first metal layer on the masked first side of the semiconductor wafer by cold spraying or by high velocity oxygen fuel spraying or by cold plasma assisted deposition, such that the first metal layer does not cover the sawing lines, the deposited first metal layer having a thickness of 50 µm or more, singulating the semiconductor wafer into a plurality of semiconductor dies by sawing the semiconductor wafer along the sawing lines, and encapsulating the plurality of semiconductor dies with an encapsulant such that the first metal layer is exposed on a first side of the encapsulant.

Example 2 is the method of example 1, further comprising: masking the sawing lines on the second side of the semiconductor wafer, and depositing a second metal layer on the masked second side of the semiconductor wafer by cold spraying or by high velocity oxygen fuel spraying or by cold plasma assisted deposition, such that the second metal layer does not cover the sawing lines, wherein the plurality of semiconductor dies is encapsulated such that the second metal layer is exposed on a second side of the encapsulant opposite the first side.

Example 3 is the method of example 2, wherein the second metal layer on a semiconductor die of the plurality of semiconductor dies comprises a power contact part coupled to a power electrode of the semiconductor die and a control contact part coupled to a control electrode of the semiconductor die.

Example 4 is the method of example 2 or 3, further comprising: transferring the semiconductor wafer from the first carrier to a second carrier prior to depositing the second metal layer, wherein the semiconductor wafer is arranged on the second carrier such that the first side of the semiconductor wafer faces the second carrier.

Example 5 is the method of one of examples 2 to 4, further comprising: covering the first metal layer and/or the second metal layer with a film prior to encapsulating the plurality of semiconductor dies, and removing the film after the encapsulating.

Example 6 is the method of one of the preceding examples, further comprising: depositing a seed layer on the semiconductor wafer prior to depositing the first metal layer, the seed layer being deposited by electroplating or by sputtering.

Example 7 is the method of one of the preceding examples, wherein the mask is a shaped piece arranged over the semiconductor wafer or wherein the mask is a deposited and structured organic material layer.

Example 8 is the method of one of the preceding examples, wherein the mask is removed prior to singulating the semiconductor wafer.

Example 9 is the method of one of the preceding examples, wherein no planarization is performed on the first metal layer prior to encapsulating the plurality of semiconductor dies.

Example 10 is the method of one of the preceding examples, wherein the first metal layer comprises or consists of Cu.

Example 11 is a semiconductor package, comprising: a semiconductor die comprising a first side and an opposing second side, a seed layer deposited on the first side of the semiconductor die, a first metal layer deposited on the seed layer, and an encapsulant encapsulating the semiconductor die, wherein the first metal layer is exposed on a first side of the encapsulant, wherein the first metal layer has a different crystal structure than the seed layer, and wherein the first metal layer has a thickness of at least 50 μm, measured perpendicular to the first side of the semiconductor die.

Example 12 is the semiconductor package of example 11, wherein the first metal layer is deposited by cold spraying or by high velocity oxygen fuel spraying or by cold plasma assisted deposition.

Example 13 is the semiconductor package of example 11 or 12, further comprising: a second metal layer deposited on the second side of the semiconductor die, wherein the second metal layer is exposed on a second side of the encapsulant opposite the first side, and wherein the second metal layer has a thickness of at least 50 μm.

Example 14 is the semiconductor package of one of examples 11 to 13, wherein the first side of the encapsulant is arranged in a first plane parallel to the first side of the semiconductor die and wherein the first metal layer extends from the seed layer to the first plane and beyond the first plane.

Example 15 is the semiconductor package of one of examples 11 to 14, wherein an outer surface of the first metal layer has a coarse, non-planarized structure.

Example 16 is an embedded PCB module, comprising: a base plate, a further layer on the base plate comprising a cavity or cavities, a semiconductor package according to any of examples 11 to 15 embedded in at least one of the cavities, and an upper plate.

Example 17 is an apparatus comprising means for performing the method of anyone of examples 1 to 10.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A method for fabricating a semiconductor package, the method comprising:
   providing a semiconductor wafer comprising a first side and an opposing second side, the semiconductor wafer being arranged on a first carrier such that the second side of the semiconductor wafer faces the first carrier;
   masking sawing lines on the first side of the semiconductor wafer with a mask;
   depositing a first metal layer on the masked first side of the semiconductor wafer by cold spraying or by high velocity oxygen fuel spraying or by cold plasma assisted deposition, such that the first metal layer does not cover the sawing lines, the deposited first metal layer having a thickness of 50 μm or more;
   singulating the semiconductor wafer into a plurality of semiconductor dies by sawing the semiconductor wafer along the sawing lines; and
   encapsulating the plurality of semiconductor dies with an encapsulant such that the first metal layer is exposed on a first side of the encapsulant.

2. The method of claim 1, further comprising:
   masking the sawing lines on the second side of the semiconductor wafer; and
   depositing a second metal layer on the masked second side of the semiconductor wafer by cold spraying or by high velocity oxygen fuel spraying or by cold plasma assisted deposition, such that the second metal layer does not cover the sawing lines,
   wherein the plurality of semiconductor dies is encapsulated such that the second metal layer is exposed on a second side of the encapsulant opposite the first side of the encapsulant.

3. The method of claim 2, wherein the second metal layer on a semiconductor die of the plurality of semiconductor dies comprises a power contact part coupled to a power electrode of the semiconductor die, and a control contact part coupled to a control electrode of the semiconductor die.

4. The method of claim 2, further comprising:
   transferring the semiconductor wafer from the first carrier to a second carrier prior to depositing the second metal layer,
   wherein the semiconductor wafer is arranged on the second carrier such that the first side of the semiconductor wafer faces the second carrier.

5. The method of claim 2, further comprising:
   covering the first metal layer and/or the second metal layer with a film prior to encapsulating the plurality of semiconductor dies; and
   removing the film after the encapsulating.

6. The method of claim 1, further comprising:
   depositing a seed layer on the semiconductor wafer prior to depositing the first metal layer, the seed layer being deposited by electroplating or by sputtering.

7. The method of claim 1, wherein the mask is a shaped piece arranged over the semiconductor wafer.

8. The method of claim 1, wherein the mask is a deposited and structured organic material layer.

9. The method of claim 1, wherein the mask is removed prior to singulating the semiconductor wafer.

10. The method of claim 1, wherein no planarization is performed on the first metal layer prior to encapsulating the plurality of semiconductor dies.

11. The method of claim 1, wherein the first metal layer comprises Cu.

12. A semiconductor package, comprising:
    a semiconductor die comprising a first side and an opposing second side;
    a seed layer deposited on the first side of the semiconductor die;
    a first metal layer deposited on the seed layer;

a second metal layer deposited on the second side of the semiconductor die; and an encapsulant encapsulating the semiconductor die, wherein the first metal layer is exposed on a first side of the encapsulant, wherein the first metal layer has a different crystal structure than the seed layer, wherein the first metal layer has a thickness of at least 50 µm, measured perpendicular to the first side of the semiconductor die, wherein the second metal layer is exposed on a second side of the encapsulant opposite the first side of the encapsulant, wherein the second metal layer has a thickness of at least 50 µm.

13. The semiconductor package of claim 12, wherein the first metal layer is deposited by cold spraying or by high velocity oxygen fuel spraying or by cold plasma assisted deposition.

14. The semiconductor package of claim 12, wherein the first side of the encapsulant is arranged in a first plane parallel to the first side of the semiconductor die, and wherein the first metal layer extends from the seed layer to the first plane and beyond the first plane.

15. The semiconductor package of claim 12, wherein an outer surface of the first metal layer has a coarse, non-planarized structure.

16. An embedded PCB module, comprising:
a base plate;
a further layer on the base plate and comprising at least one cavity;
a semiconductor package embedded in that at least one cavity; and
an upper plate,
wherein the semiconductor package comprises:
    a semiconductor die comprising a first side and an opposing second side;
    a seed layer deposited on the first side of the semiconductor die;
    a first metal layer deposited on the seed layer;
    a second metal layer deposited on the second side of the semiconductor die; and
    an encapsulant encapsulating the semiconductor die,
    wherein the first metal layer is exposed on a first side of the encapsulant,
    wherein the first metal layer has a different crystal structure than the seed layer,
    wherein the first metal layer has a thickness of at least 50 µm, measured perpendicular to the first side of the semiconductor die,
    wherein the second metal layer is exposed on a second side of the encapsulant opposite the first side of the encapsulant,
    wherein the second metal layer has a thickness of at least 50 µm.

17. A semiconductor package, comprising:
a semiconductor die comprising a first side and an opposing second side;
a seed layer deposited on the first side of the semiconductor die;
a first metal layer deposited on the seed layer; and
an encapsulant encapsulating the semiconductor die,
wherein the first metal layer is exposed on a first side of the encapsulant,
wherein the first metal layer has a different crystal structure than the seed layer,
wherein the first metal layer has a thickness of at least 50 µm, measured perpendicular to the first side of the semiconductor die,
wherein the first side of the encapsulant is arranged in a first plane parallel to the first side of the semiconductor die,
wherein the first metal layer extends from the seed layer to the first plane and beyond the first plane.

18. The semiconductor package of claim 17, wherein the first metal layer is deposited by cold spraying or by high velocity oxygen fuel spraying or by cold plasma assisted deposition.

19. The semiconductor package of claim 17, further comprising:
a second metal layer deposited on the second side of the semiconductor die,
wherein the second metal layer is exposed on a second side of the encapsulant opposite the first side of the encapsulant,
wherein the second metal layer has a thickness of at least 50 µm.

20. The semiconductor package of claim 17, wherein an outer surface of the first metal layer has a coarse, non-planarized structure.

* * * * *